(12) United States Patent
Lai et al.

(10) Patent No.: US 8,072,064 B1
(45) Date of Patent: Dec. 6, 2011

(54) SEMICONDUCTOR PACKAGE AND METHOD FOR MAKING THE SAME

(75) Inventors: Yi-Shao Lai, Kaohsiung (TW);
Tsung-Yueh Tsai, Kaohsiung (TW);
Ming-Kun Chen, Kaohsiung (TW);
Hsiao-Chuan Chang, Kaohsiung (TW);
Ming-Hsiang Cheng, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 12/819,796

(22) Filed: Jun. 21, 2010

(51) Int. Cl.
*H01L 21/00* (2006.01)

(52) U.S. Cl. ........................ 257/723; 438/109

(58) Field of Classification Search .......... 438/106–127; 257/723–726
See application file for complete search history.

(56) References Cited

U.S. PATENT DOCUMENTS

| | | | |
|---|---|---|---|
| 5,818,112 A | 10/1998 | Weber et al. | |
| 6,310,400 B1 | 10/2001 | Doyle et al. | |
| 6,600,325 B2 | 7/2003 | Coates et al. | |
| 7,067,910 B2 | 6/2006 | Drost et al. | |
| 7,329,597 B2 * | 2/2008 | Chung et al. | 438/611 |
| 7,425,760 B1 | 9/2008 | Guenin et al. | |

* cited by examiner

*Primary Examiner* — Richard A. Booth
(74) *Attorney, Agent, or Firm* — McCracken & Frank LLC

(57) ABSTRACT

The present invention relates to a semiconductor package and a method for making the same. The semiconductor package includes a first chip and a second chip. The first chip comprises a first active surface, at least one first non-top metal layer and a plurality of first signal coupling pads. The first non-top metal layer is disposed adjacent to and spaced apart from the first active surface by a second distance. The first signal coupling pads are disposed on the first non-top metal layer. The second chip is electrically connected to the first chip. The second chip comprises a second active surface, at least one second non-top metal layer and a plurality of third signal coupling pads. The second active surface faces the first active surface of the first chip. The second non-top metal layer is disposed adjacent to and spaced apart from the second active surface by a fourth distance. The third signal coupling pads are disposed on the second non-top metal layer and capacitively coupled to the first signal coupling pads of the first chip, so as to provide proximity communication between the first chip and the second chip. Whereby, the gap variation between the first signal coupling pads of the first chip and the third signal coupling pads of the second chip is under stringent control of the second distance and the fourth distance. Therefore, the mass-production yield of the semiconductor package is increased.

21 Claims, 9 Drawing Sheets

SEMICONDUCTOR PACKAGE AND METHOD FOR MAKING THE SAME

BACKGROUND OF THE INVENTION

1. Field of the Invention

The present invention relates to a semiconductor package and a method for making the same, and more particularly to a semiconductor package having signal coupling pads and a method for making the same.

2. Description of the Related Art

FIG. 1 shows a cross-sectional view of a conventional semiconductor package. The conventional semiconductor package 1 comprises a first substrate 11, a first chip 12, an underfill 13, a dielectric layer 14, a second substrate 15, a plurality of wires 16, a molding compound 17 and a plurality of solder balls 18. The first substrate 11 has a first surface 111 and a second surface 112. The first chip 12 is disposed on the first substrate 11, and comprises a plurality of first bumps 121. The underfill 13 encapsulates the first bumps 121 of the first chip 12. The dielectric layer 14 is disposed on the first chip 12. The second substrate 15 is disposed on the dielectric layer 14, and comprises a first surface 151, a second surface 152 and a plurality of input/output pads 153. The first surface 151 contacts the dielectric layer 14. The input/output pads 153 are disposed on the second surface 152. The wires 16 electrically connect the second substrate 15 and the first substrate 11. The molding compound 17 encapsulates the first surface 111 of the first substrate 11, the first chip 12, the dielectric layer 14, the first surface 151 of the second substrate 15 and the wires 16, and exposes the input/output pads 153 of the second substrate 15. The solder balls 18 are disposed on the second surface 112 of the first substrate 11.

The conventional semiconductor package 1 has the following disadvantages. A dielectric layer 14 has to be disposed between the first chip 12 and the second substrate 15, so the thermal stability of fine pitch is decreased, the thickness of the semiconductor package 1 is increased and the manufacturing cost is increased.

Therefore, it is necessary to provide a semiconductor package and a method for making the same to solve the above problems.

SUMMARY OF THE INVENTION

The present invention is directed to a semiconductor package. The semiconductor package comprises a first chip and a second chip. The first chip comprises a first active surface, a first back surface, a first top metal layer, at least one first non-top metal layer, a plurality of first signal coupling pads, a plurality of second signal coupling pads, at least one first power pad, at least one first ground pad, at least one second power pad, at least one second ground pad, at least one first through-chip via and at least one second through-chip via. The first top metal layer is disposed adjacent to the first active surface, and spaced apart from the first active surface by a first distance. The first non-top metal layer is disposed adjacent to the first active surface, and spaced apart from the first active surface by a second distance. The second distance is greater than the first distance. The first signal coupling pads are disposed on the first non-top metal layer. The second signal coupling pads are disposed adjacent to the first back surface and electrically connected to the first signal coupling pads. The first power pad and the first ground pad are disposed adjacent to the first active surface. The second power pad and the second ground pad are disposed adjacent to the first back surface. The first through-chip via electrically connects the first power pad and the second power pad. The second through-chip via electrically connects the first ground pad and the second ground pad.

The second chip is electrically connected to the first chip. The second chip comprises a second active surface, a second top metal layer, at least one second non-top metal layer, a plurality of third signal coupling pads, at least one third power pad and at least one third ground pad. The second active surface faces the first active surface of the first chip. The second top metal layer is disposed adjacent to the second active surface, and spaced apart from the second active surface by a third distance. The second non-top metal layer is disposed adjacent to the second active surface, and spaced apart from the second active surface by a fourth distance. The fourth distance is greater than the third distance. The third signal coupling pads are disposed on the second non-top metal layer and capacitively coupled to the first signal coupling pads of the first chip, so as to provide proximity communication between the first chip and the second chip. The third power pad and the third ground pad are disposed adjacent to the second active surface and electrically connected to the first power pad and the first ground pad of the first chip respectively.

The present invention is further directed to a method for making a semiconductor package. The method comprises the following steps: (a) providing a first semiconductor device, wherein the first semiconductor device comprises a first active surface, a first back surface, a first top metal layer, at least one first non-top metal layer, a plurality of first signal coupling pads, a plurality of second signal coupling pads, at least one first power pad, at least one first ground pad, at least one second power pad and at least one second ground pad, the first top metal layer is disposed adjacent to the first active surface and spaced apart from the first active surface by a first distance, the first non-top metal layer is disposed adjacent to the first active surface and spaced apart from the first active surface by a second distance, the second distance is greater than the first distance, the first signal coupling pads are disposed on the first non-top metal layer, the second signal coupling pads are disposed adjacent to the first back surface and electrically connected to the first signal coupling pads, the first power pad and the first ground pad are disposed adjacent to the first active surface, the second power pad and the second ground pad are disposed adjacent to the first back surface; (b) providing a second semiconductor device, wherein the second semiconductor device comprises a second active surface, a second top metal layer, at least one second non-top metal layer, a plurality of third signal coupling pads, at least one third power pad and at least one third ground pad, the second active surface faces the first active surface of the first semiconductor device, the second top metal layer is disposed adjacent to the second active surface and spaced apart from the second active surface by a third distance, the second non-top metal layer is disposed adjacent to the second active surface and spaced apart from the second active surface by a fourth distance, the fourth distance is greater than the third distance, the third signal coupling pads are disposed on the second non-top metal layer and capacitively coupled to the first signal coupling pads of the first semiconductor device, so as to provide proximity communication between the first semiconductor device and the second semiconductor device, the third power pad and the third ground pad are disposed adjacent to the second active surface and electrically connected to the first power pad and the first ground pad of the first semiconductor device respectively; (c) attaching the second semiconductor device to the first semiconductor device, wherein the second active surface of the second semiconductor device faces the first active surface of the first semiconductor device; (d) removing part of the first semiconductor device, so as to form a first through hole and a second through hole, wherein the first through hole extends from the first power pad to the second power pad, and the second through hole extends from the first ground pad to the second ground pad; and (e) forming a conductive material in the first through hole and the second through hole, so as to form a first through-wafer via and a second through-wafer via, wherein the first through-wafer via electrically connects the first power pad and the second power pad, and the second through-wafer via electrically connects the first ground pad and the second ground pad.

Whereby, the gap variation between the first signal coupling pads of the first chip and the third signal coupling pads of the second chip is under stringent control of the second distance and the fourth distance. Therefore, the mass-production yield of the semiconductor package is increased.

DETAILED DESCRIPTION OF THE INVENTION

Figure 1:
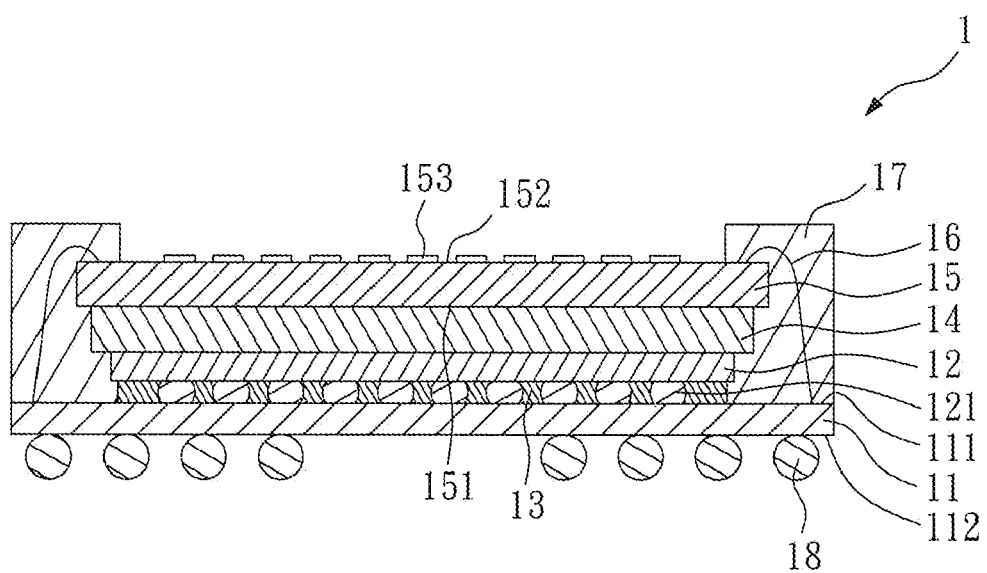
FIG. 1 is a cross-sectional view of a conventional semiconductor package.
Figure 2:
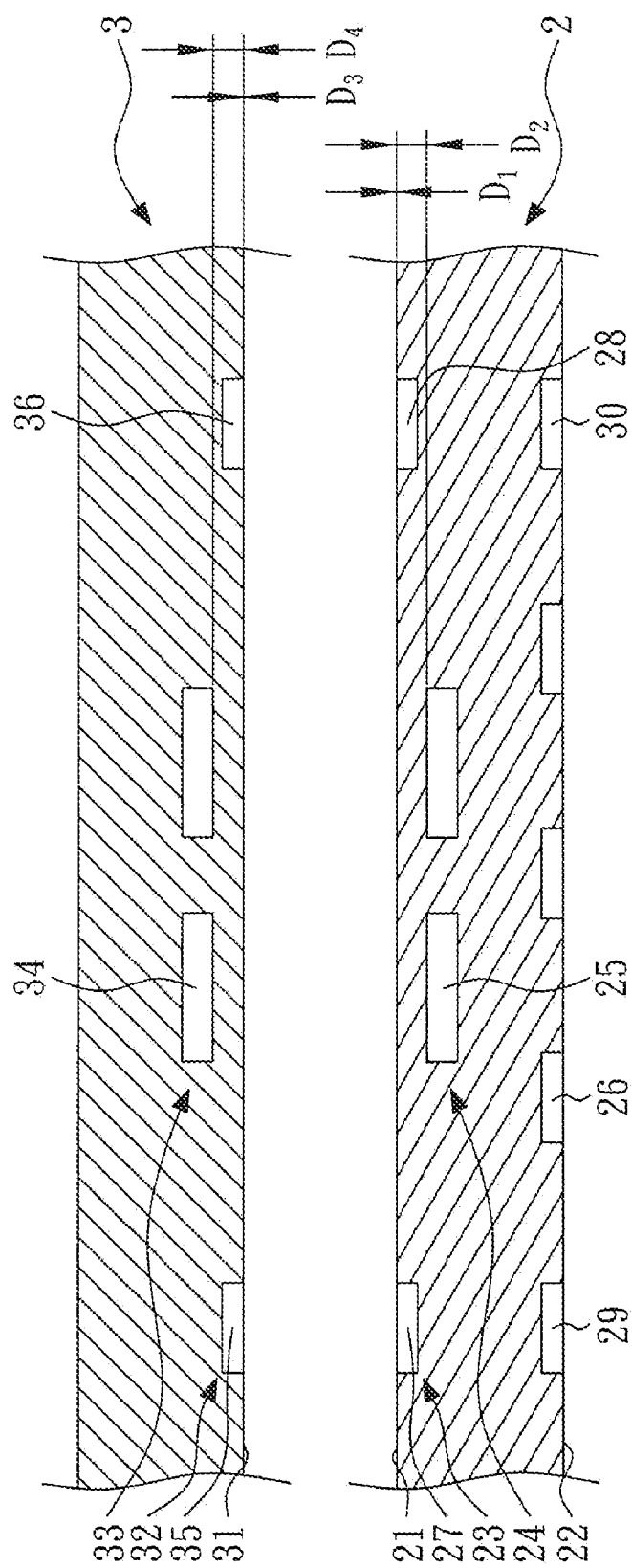
FIGS. 2 to 6 are schematic views of a method for making a semiconductor package according to a first embodiment of the present invention.

FIGS. 2 to 6 show schematic views of a method for making a semiconductor package according to a first embodiment of the present invention. As shown in FIG. 2, a first semiconductor device 2 and a second semiconductor device 3 are provided. In the embodiment, both the first semiconductor device 2 and the second semiconductor device 3 are wafers. The first semiconductor device 2 comprises a first active surface 21, a first back surface 22, a first top metal layer 23, at least one first non-top metal layer 24, a plurality of first signal coupling pads 25, a plurality of second signal coupling pads 26, at least one first power pad 27, at least one first ground pad 28, at least one second power pad 29 and at least one second ground pad 30. In the present invention, the term "top metal layer" is the outmost metal layer of a semiconductor device (a wafer or a chip) in the side of an active region. The top metal layer of the semiconductor device (a wafer or a chip) is designed to provide the interface between two semiconductor devices (wafers or chips). The first top metal layer 23 and the first non-top metal layer 24 are disposed adjacent to the first active surface 21 and spaced apart from the first active surface 21 by a first distance $D_1$ and a second distance $D_2$ respectively. The second distance $D_2$ is greater than the first distance $D_1$. In the embodiment, the first top metal layer 23 is on the first active surface 21, so the first distance $D_1$ is zero.

However, in other embodiment, a passivation layer (not shown) is disposed on the first top metal layer 23, and the first distance $D_1$ is not zero. The first signal coupling pads 25 are disposed on the first non-top metal layer 24. The second signal coupling pads 26 are disposed adjacent to the first back surface 22 and electrically connected to the first signal coupling pads 25 by through silicon vias (not shown). The first power pad 27 and the first ground pad 28 are disposed adjacent to the first active surface 21. The second power pad 29 and the second ground pad 30 are disposed adjacent to the first back surface 22 and electrically connected to the first power pad 27 and the first ground pad 28 by through silicon vias (not shown).

The second semiconductor device 3 comprises a second active surface 31, a second top metal layer 32, at least one second non-top metal layer 33, a plurality of third signal coupling pads 34, at least one third power pad 35 and at least one third ground pad 36. The second active surface 31 faces the first active surface 21 of the first semiconductor device 2. The second top metal layer 32 and the second non-top metal layer 33 are disposed adjacent to the second active surface 31 and spaced apart from the second active surface 31 by a third distance $D_3$ and a fourth distance $D_4$ respectively. The fourth distance $D_4$ is greater than the third distance $D_3$. In the embodiment, the second top metal layer 32 is on the second active surface 31, so the third distance $D_3$ is zero. However, in other embodiment, a passivation layer (not shown) is disposed on the second top metal layer 32, and the third distance $D_3$ is not zero. The third signal coupling pads 34 are disposed on the second non-top metal layer 33 and capacitively coupled to the first signal coupling pads 25 of the first semiconductor device 2, so as to provide proximity communication between the first semiconductor device 2 and the second semiconductor device 3. The third power pad 35 and the third ground pad 36 are disposed adjacent to the second active surface 31 and electrically connected to the first power pad 27 and the first ground pad 28 of the first semiconductor device 2 respectively.

Figure 3:
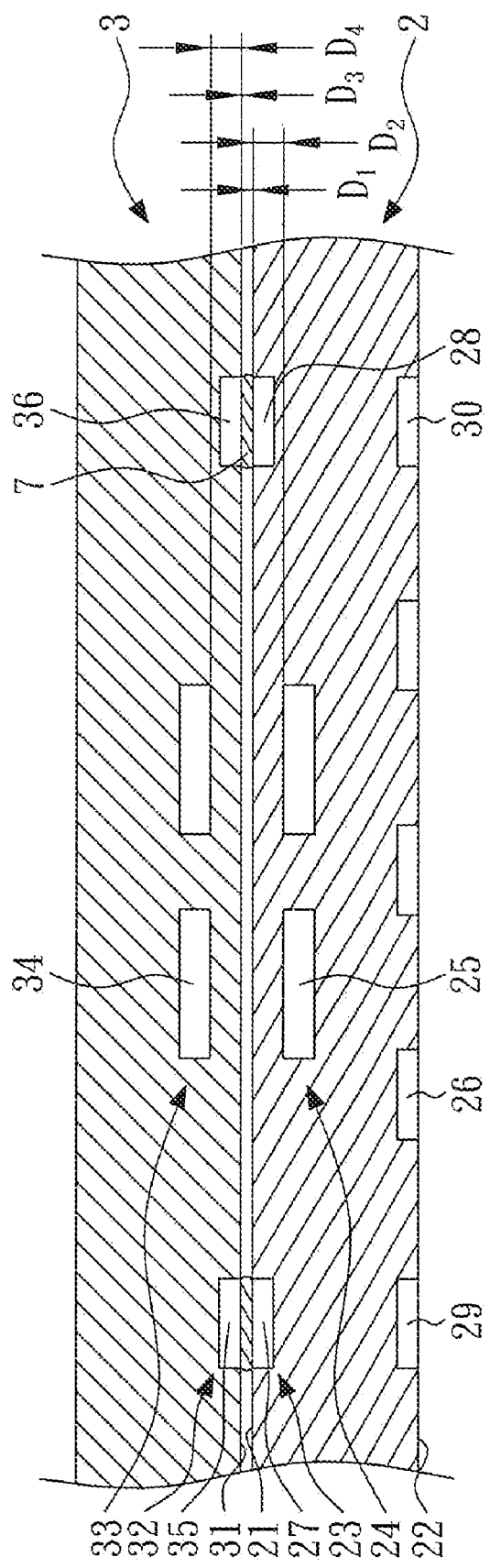

As shown in FIG. 3, the second semiconductor device 3 is attached to the first semiconductor device 2. The second active surface 31 of the second semiconductor device 3 faces the first active surface 21 of the first semiconductor device 2. In the embodiment, both the first semiconductor device 2 and the second semiconductor device 3 have opposing pads, e.g., the first ground pad 28 and the third ground pad 36, and an electrically conductive layer 7 is formed therebetween. The electrically conductive layer 7 is used as an adhesive layer and provides an electrical path. The electrically conductive layer 7 or other bonding material is required for electrical connection between the third power pad 35 and the third ground pad 36 of the second semiconductor device 3 and the first power pad 27 and the first ground pad 28 of the first semiconductor device 2.

In other embodiments, the opposing pads themselves are directly welded to join the first semiconductor device 2 and the second semiconductor device 3. Specifically, the opposing pads, e.g., the first ground pad 28 and the third ground pad 36, of the first semiconductor device 2 and the second semiconductor device 3 are aligned and contacted, and the stacked structure is then annealed for a period at a temperature, which is sufficient to bond the first ground pad 28 and the third ground pad 36. By way of example, assuming the first ground pad 28 and the third ground pad 36 are formed of copper, the stacked structure is annealed for about 0.55 hour to about 10 hours at about 240° C. to about 500° C. under suitable pressure. Optionally, the first active surface 21 of the first semiconductor device 2 may directly contact the second active surface 31 of the second semiconductor device 3.

Figure 4:
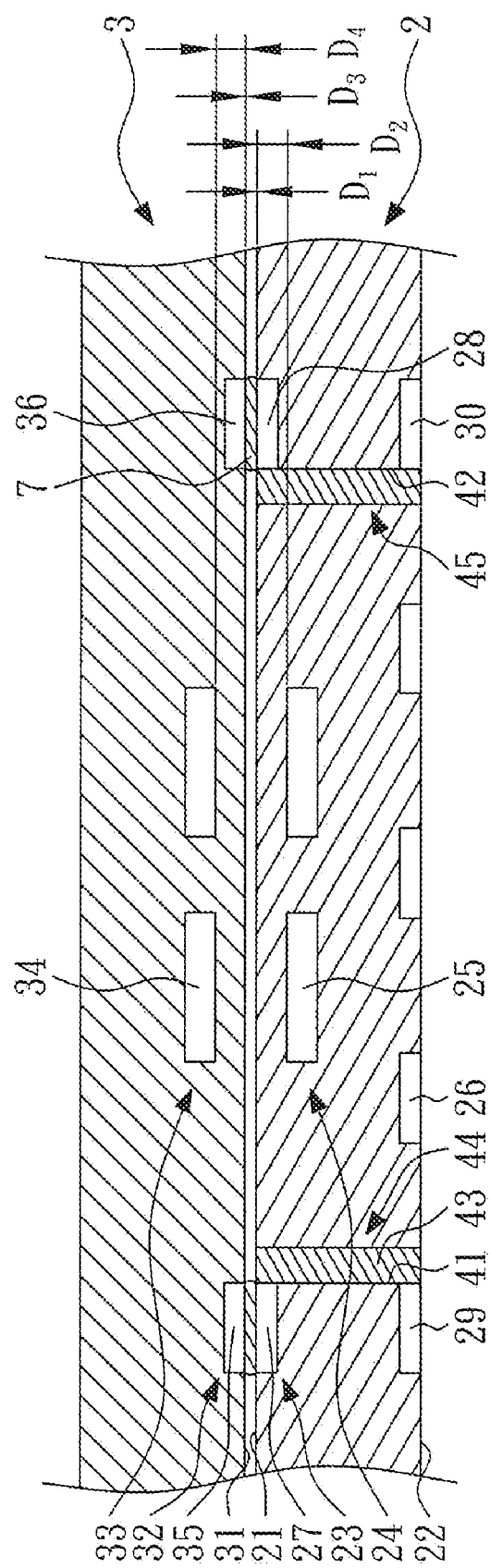

As shown in FIG. 4, a first through-wafer via 44 is formed to electrically connect the first power pad 27 and the second power pad 29, and a second through-wafer via 45 is formed to electrically connect the first ground pad 28 and the second ground pad 30. Although FIG. 4 shows a partial view, it is known that a full chip would contain an array of pads and corresponding through-wafer vias. The general steps for forming the through-wafer vias are described as below. First, a plurality of holes are formed by laser drilling or deep reactive-ion etching (DRIE). Then, an insulation layer is formed on the wall of the holes. In the end, a metallization process is conducted, that is, forming a conductive material in the holes. When a "blind via" approach is used, the holes are not etched through the semiconductor device, so that a "through via" is rendered only after the semiconductor device is suitably thinned to expose the bottom of the via.

In the embodiment, part of the first semiconductor device 2 is removed, so as to form a first through hole 41 and a second through hole 42. The first through hole 41 extends from the first power pad 27 to the second power pad 29. The second through hole 42 extends from the first ground pad 28 to the second ground pad 30. In the embodiment, the first through hole 41 and the second through hole 42 are formed by laser drilling. In other applications, the first through hole 41 and the second through hole 42 may extend to the second semiconductor device 3, that is, part of the second semiconductor device 3 may be removed to form the first through hole 41 and the second through hole 42. After an insulation layer (not shown) is formed on the wall of the first through hole 41 and the second through hole 42, a conductive material 43 is formed in the first through hole 41 and the second through hole 42, so as to form the first through-wafer via 44 and the second through-wafer via 45. In the embodiment, the conductive material 43 is formed by plating.

Figure 5:
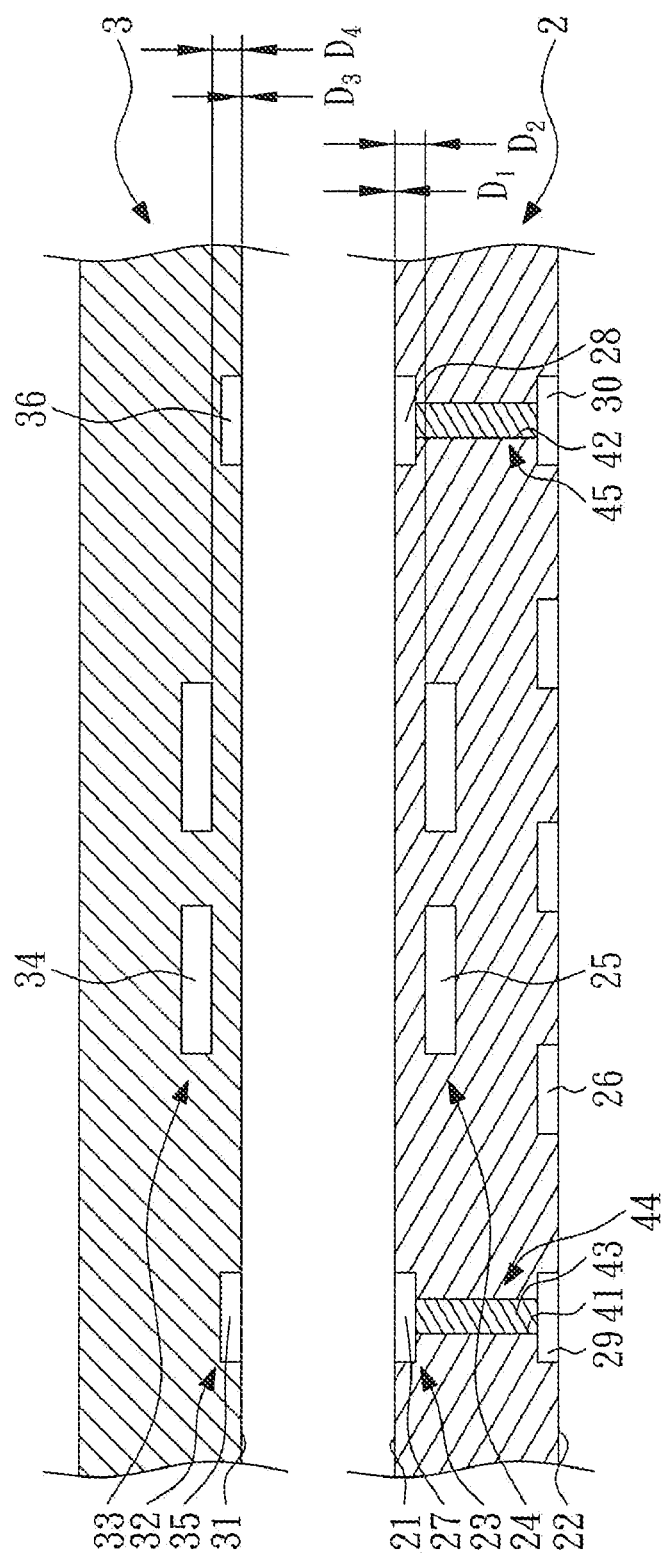

However, in other applications, the first semiconductor device 2 may further comprises the first through-wafer via 44 and the second through-wafer via 45 at the beginning, as shown in FIG. 5. That is, the first through-wafer via 44 and the second through-wafer via 45 are formed before providing the first semiconductor device 2, and the second semiconductor device 3 is attached to the first semiconductor device 2 later.

Figure 6:
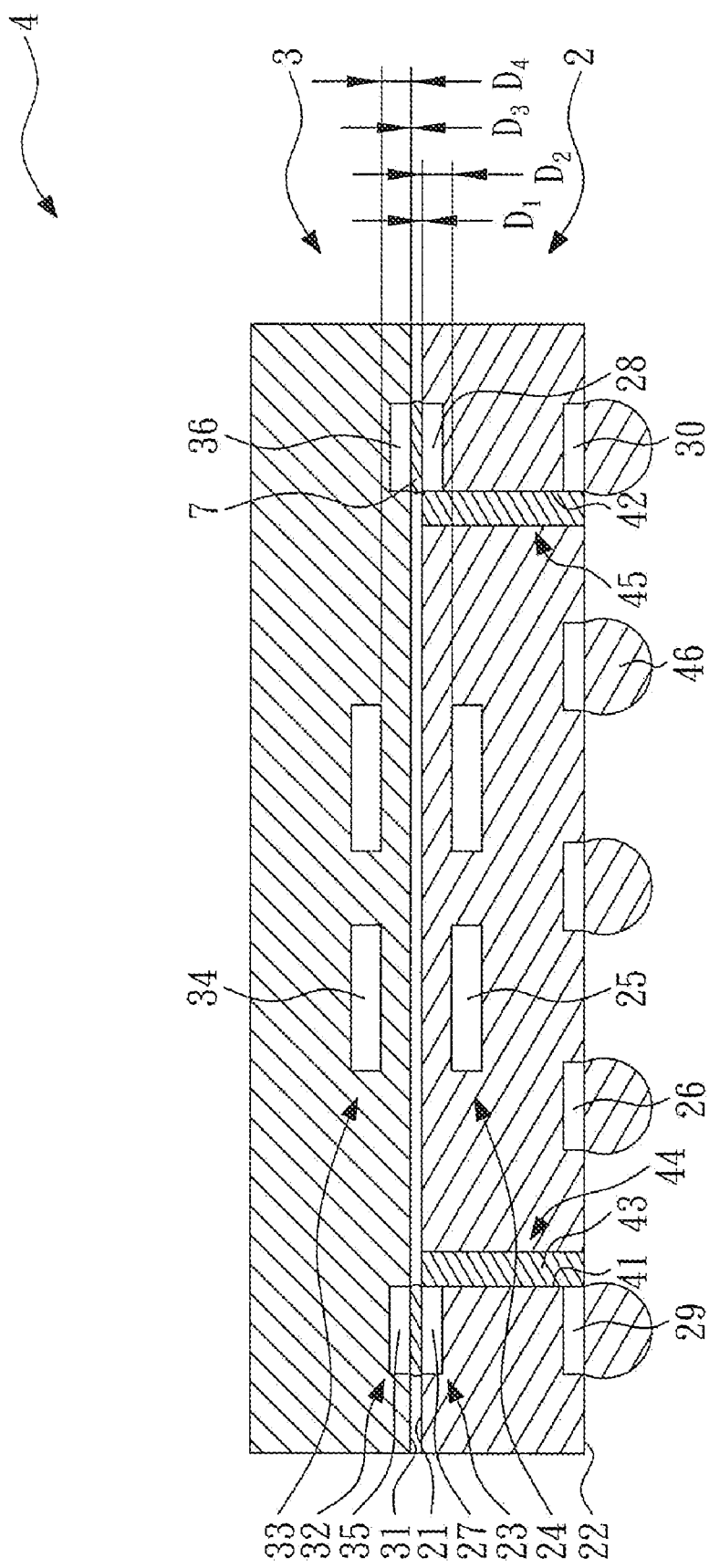

As shown in FIG. 6, in the embodiment, a plurality of conductive bumps 46 are further formed on the first back surface 22 of the first semiconductor device 2. In the embodiment, the first semiconductor device 2 and the second semiconductor device 3 are sawed to form a plurality of semiconductor packages 4 according to a first embodiment of the present invention, the first semiconductor device 2, which is a wafer, is divided into a plurality of first chips 2, and the second semiconductor device 3, which is a wafer, is divided into a plurality of second chips 3. However, in other applications, the first semiconductor device 2 and the second semiconductor device 3 may be chips, and thus, after forming the conductive bumps 46, the semiconductor packages 4 are formed.

FIG. 6 shows a cross-sectional view of a semiconductor package according to the first embodiment of the present invention. The semiconductor package 4 comprises a first chip 2 and a second chip 3. The first chip 2 is substantially the same as the first semiconductor device 2 (FIG. 2), and the same elements are designated by the same reference numbers. The difference between the first chip 2 and the first semiconductor device 2 is that the first chip 2 further comprises at least one first through-chip via 44 and at least one second through-chip via 45. The first through-chip via 44 electrically connects the first power pad 27 and the second power pad 29. The second through-chip via 45 electrically connects the first ground pad 28 and the second ground pad 30.

The second chip 3 is electrically connected to the first chip 2. The second chip 3 is substantially the same as the second semiconductor device 3 (FIG. 2), and the same elements are designated by the same reference numbers.

In the embodiment, the second semiconductor device 3 is attached to the first semiconductor device 2 by forming an electrically conductive layer 7 between the first ground pad 28 and the third ground pad 36, and between the second power pad 29 and the third power pad 35. However, in other applications, the second semiconductor device 3 can be attached to the first semiconductor device 2 by directing welding the first ground pad 28 and the third ground pad 36, and the second power pad 29 and the third power pad 35, and the first active surface 21 of the first semiconductor device 2 contacts the second active surface 31 of the second semiconductor device 3.

It should be noted that the first chip 2 and the second chip 3 communicate with each other through proximity communication between the first signal coupling pads 25 and the third signal coupling pads 34, instead of direct electrical connections; however, electrical power or ground is transmitted between the first chip 2 and the second chip 3 through direct electrical connections.

In order to achieve the function of proximity communication, part of the first chip 2 and the second chip 3 are placed face-to-face in a manner that aligns the transmitter circuit with the receiver circuit in extremely close proximity, for example, with only microns of separation between them. The signals between the transmitter circuit and the receiver circuit may be transmitted by inductive or capacitive coupling with low overall communication cost.

Take transmission by capacitive coupling for example. The first signal coupling pads 25 of the first chip 2 and the third signal coupling pads 34 of the second chip 3 are aligned with each other. Since the first signal coupling pads 25 and the third signal coupling pads 34 are not in physical contact with each other, there are capacitances between the first signal coupling pads 25 of the first chip 2 and the third signal coupling pads 34 of the second chip 3. It is this capacitive coupling that provides signal paths between the first chip 2 and the second chip 3. Changes in the electrical potential of the first signal coupling pads 25 of the first chip 2 cause corresponding changes in the electrical potential of the corresponding third signal coupling pads 34 of the second chip 3. Suitable drivers of the transmitter circuit and sensing circuits of the receiver circuit in the first chip 2 and the second chip 3 make communication through this small capacitance possible.

Whereby, the gap variation between the first signal coupling pads 25 of the first chip 2 and the third signal coupling pads 34 of the second chip 3 is under stringent control of the second distance $D_2$ and the fourth distance $D_4$. Therefore, the mass-production yield of the semiconductor package 4 is increased.

Figure 7:
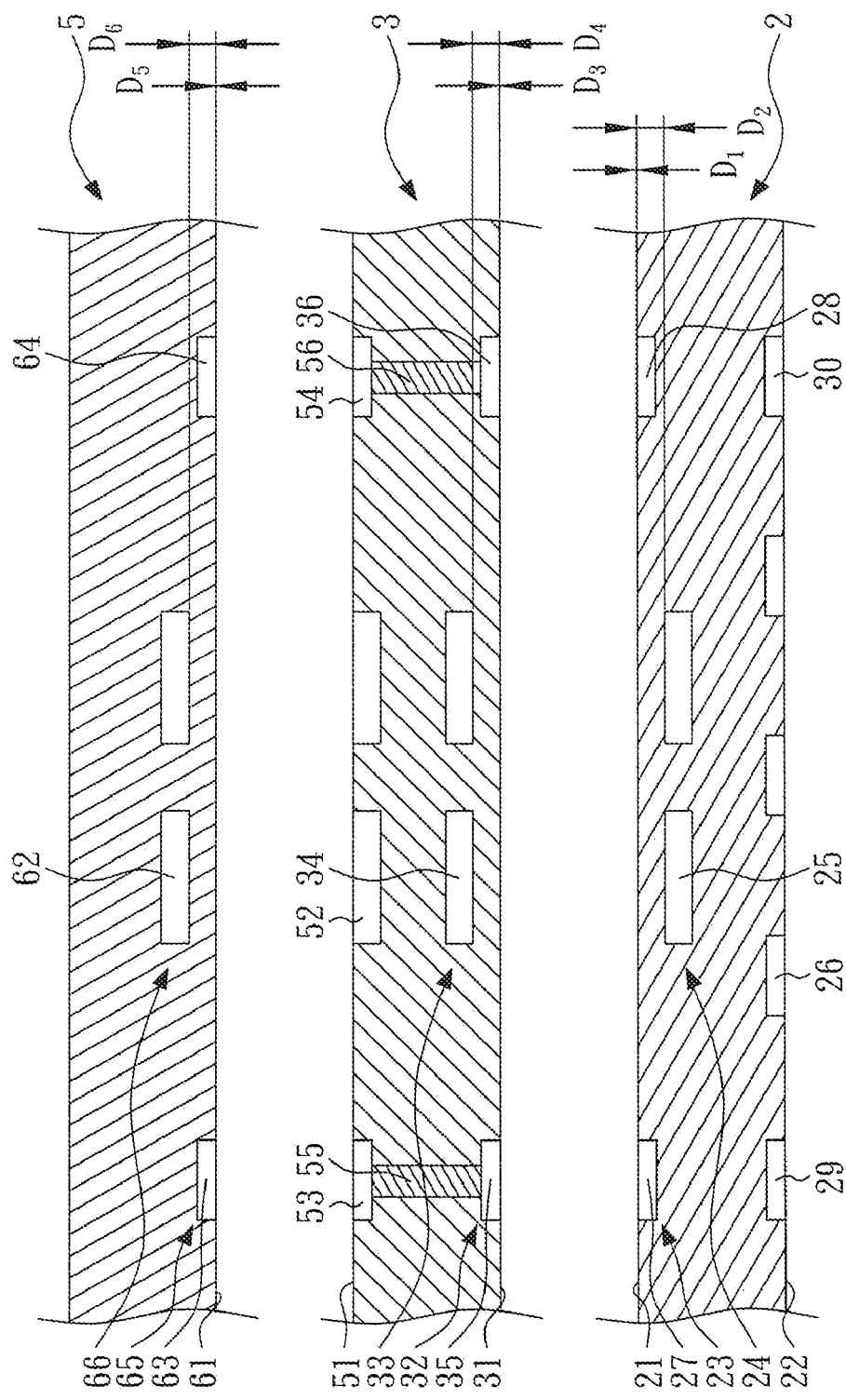
FIGS. 7 to 9 are schematic views of a method for making a semiconductor package according to a second embodiment of the present invention.
Figure 8:
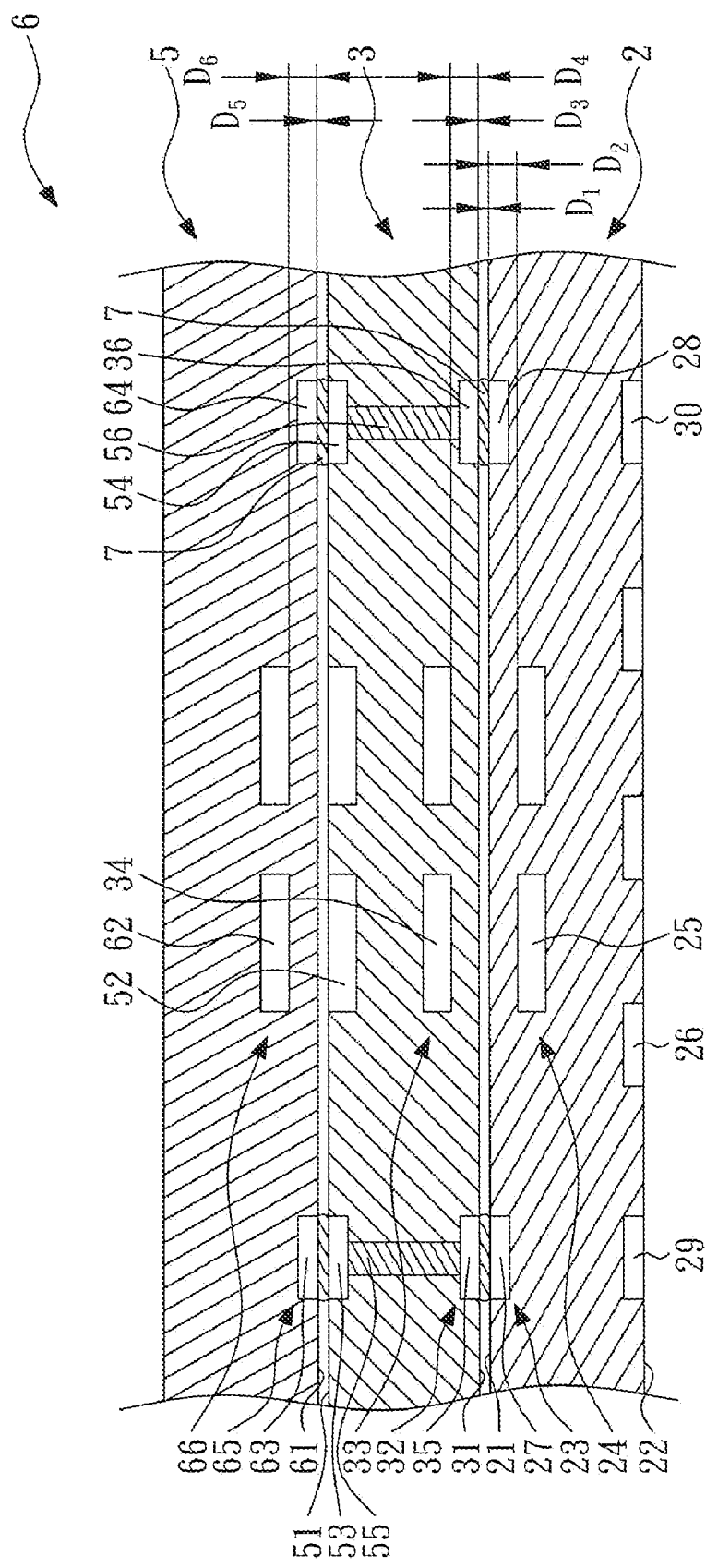
Figure 9:
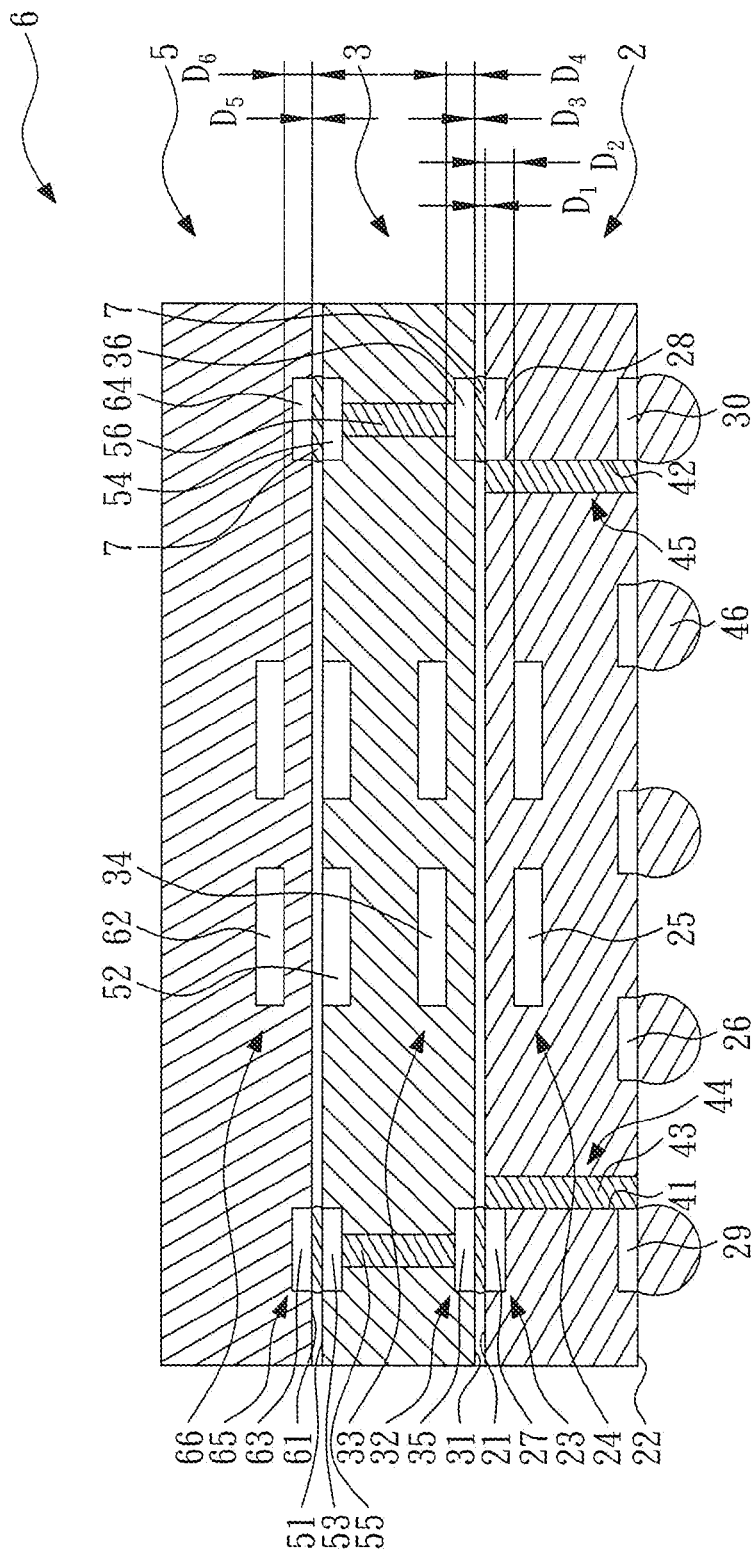

FIGS. 7 to 9 show schematic views of a method for making a semiconductor package according to a second embodiment of the present invention. The method according to the second embodiment is substantially the same as the method (FIGS. 2 to 6) according to the first embodiment, and the same elements are designated by the same reference numbers. The difference between the method according to the second embodiment and the method according to the first embodiment (FIGS. 2 to 6) is that before sawing the first semiconductor device 2 and the second semiconductor device 3, a third semiconductor device 5 is attached to the second semiconductor device 3. In the embodiment, the third semiconductor device 5 is a wafer.

In the embodiment, as shown in FIG. 7, the second semiconductor device 3 further comprises a second back surface 51, a plurality of fourth signal coupling pads 52, at least one fourth power pad 53, at least one fourth ground pad 54, at least one third through-wafer via 55 and at least one fourth through-wafer via 56. The fourth signal coupling pads 52 are disposed on the second back surface 51 and electrically connected to the third signal coupling pads 34. The fourth power pad 53 and the fourth ground pad 54 are disposed adjacent to the second back surface 51. The third through-wafer via 55 electrically connects the third power pad 35 and the fourth power pad 53. The fourth through-wafer via 56 electrically connects the third ground pad 36 and the fourth ground pad 54.

The third semiconductor device 5 is further provided. The third semiconductor device 5 comprises a third active surface 61, a plurality of fifth signal coupling pads 62, at least one fifth power pad 63 and at least one fifth ground pad 64. In the embodiment, the third semiconductor device 5 further comprises a third top metal layer 65 and at least one third non-top metal layer 66. The third active surface 61 faces the second back surface 51 of the second semiconductor device 3. The fifth signal coupling pads 62 are disposed adjacent to the third active surface 61 and capacitively coupled to the fourth signal coupling pads 52 of the second semiconductor device 3, so as to provide proximity communication between the second semiconductor device 3 and the third semiconductor device 5. The fifth power pad 63 and the fifth ground pad 64 are disposed adjacent to the third active surface 61 and electrically connected to the fourth power pad 53 and the fourth ground pad 54 of the second semiconductor device 3 respectively. In the embodiment, the third top metal layer 65 and the third non-top metal layer 66 are spaced apart from the third active surface 61 by a fifth distance $D_5$ and a sixth distance $D_6$ respectively. The sixth distance $D_6$ is greater than the fifth distance $D_5$. In the embodiment, the third top metal layer 65 is on the third active surface 61, so the fifth distance $D_5$ is zero. However, in other embodiment, a passivation layer (not shown) is disposed on the third top metal layer 65, and the fifth distance $D_5$ is not zero. The fifth signal coupling pads 62 are disposed on the third non-top metal layer 66.

As shown in FIG. 8, the third semiconductor device 5 is further attached to the second semiconductor device 3. The third active surface 61 of the third semiconductor device 5 faces the second back surface 51 of the second semiconductor device 3. In the embodiment, the third semiconductor device 5 is attached to the second semiconductor device 3 by forming an electrically conductive layer 7 between the fourth ground pad 54 and the fifth ground pad 64, and between the fourth power pad 53 and fifth power pad 63. However, in other applications, the third semiconductor device 5 can be attached to the second semiconductor device 3 by directing welding the fourth ground pad 54 and the fifth ground pad 64, and the fourth power pad 53 and fifth power pad 63, and the third active surface 61 of the third chip 5 contacts the second back surface 51 of the second chip 3. As shown in FIG. 9, the first through-wafer via 44, the second through-wafer via 45 and the conductive bumps 46 are formed as described above. In the embodiment, the first semiconductor device 2, the second semiconductor device 3 and the third semiconductor device 5 are sawed to form a plurality of semiconductor packages 6 according to a second embodiment of the present invention, the first semiconductor device 2, which is a wafer, is divided into a plurality of first chips 2, the second semiconductor device 3, which is a wafer, is divided into a plurality of second chips 3, and the third semiconductor device 5, which is a wafer, is divided into a plurality of third chips 5. However, in other applications, the first semiconductor device 2, the second semiconductor device 3 and the third semiconductor device 5 may be chips, and thus, after forming the conductive bumps 46, the semiconductor packages 6 are formed.

FIG. 9 shows a cross-sectional view of a semiconductor package according to the second embodiment of the present invention. The semiconductor package 6 according to the second embodiment is substantially the same as the semiconductor package 4 (FIG. 6) according to the first embodiment, and the same elements are designated by the same reference numbers. The difference between the semiconductor package 6 and the semiconductor package 4 (FIG. 2) is that the semiconductor package 6 further comprises a third chip 5.

The third chip 5 is disposed adjacent to and electrically connected to the second chip 3. The second chip 3 further comprises a second back surface 51 and a plurality of fourth signal coupling pads 52. In the embodiment, the second chip 3 further comprises at least one fourth power pad 53, at least one fourth ground pad 54, at least one third through-chip via 55 and at least one fourth through-chip via 56. The fourth signal coupling pads 52 are disposed on the second back surface 51 and electrically connected to the third signal coupling pads 34. In the embodiment, the fourth power pad 53 and the fourth ground pad 54 are disposed adjacent to the second back surface 51. The third through-chip via 55 electrically connects the third power pad 35 and the fourth power pad 53. The fourth through-chip via 56 electrically connects the third ground pad 36 and the fourth ground pad 54.

The third chip 5 comprises a third active surface 61, a plurality of fifth signal coupling pads 62, at least one fifth power pad 63 and at least one fifth ground pad 64. In the embodiment, the third chip 5 further comprises a third top metal layer 65 and at least one third non-top metal layer 66. The third active surface 61 faces the second back surface 51 of the second chip 3. The fifth signal coupling pads 62 are disposed adjacent to the third active surface 61 and capacitively coupled to the fourth signal coupling pads 52 of the second chip 3, so as to provide proximity communication between the second chip 3 and the third chip 5. The fifth power pad 63 and the fifth ground pad 64 are disposed adjacent to the third active surface 61 and electrically connected to the fourth power pad 53 and the fourth ground pad 54 of the second chip 3 respectively. In the embodiment, the third top metal layer 65 and the third non-top metal layer 66 are spaced apart from the third active surface 61 by a fifth distance $D_5$ and a sixth distance $D_6$ respectively. The sixth distance $D_6$ is greater than the fifth distance $D_5$. In the embodiment, the third top metal layer 65 is on the third active surface 61, so the fifth distance $D_5$ is zero. However, in other embodiment, a passivation layer (not shown) is disposed on the third top metal layer 65, and the fifth distance $D_s$ is not zero. The fifth signal coupling pads 62 are disposed on the third non-top metal layer 66.

In the embodiment, the third semiconductor device 5 is attached to the second semiconductor device 3 by forming an electrically conductive layer 7 between the fourth ground pad 54 and the fifth ground pad 64, and between the fourth power pad 53 and fifth power pad 63. However, in other applications, the third semiconductor device 5 can be attached to the second semiconductor device 3 by directing welding the fourth ground pad 54 and the fifth ground pad 64, and the fourth power pad 53 and fifth power pad 63, and the third active surface 61 of the third chip 5 contacts the second back surface 51 of the second chip 3.

While several embodiments of the present invention have been illustrated and described, various modifications and improvements can be made by those skilled in the art. The embodiments of the present invention are therefore described in an illustrative but not restrictive sense. It is intended that the present invention should not be limited to the particular forms as illustrated, and that all modifications which maintain the spirit and scope of the present invention are within the scope defined by the appended claims.

What is claimed is:

1. A semiconductor package, comprising:
   a first chip, comprising:
      a first active surface;
      a first back surface;
      a first top metal layer, disposed adjacent to the first active surface, and spaced apart from the first active surface by a first distance;
      at least one first non-top metal layer, disposed adjacent to the first active surface, and spaced apart from the first active surface by a second distance, wherein the second distance is greater than the first distance;
      a plurality of first signal coupling pads, disposed on the first non-top metal layer;
      a plurality of second signal coupling pads, disposed adjacent to the first back surface and electrically connected to the first signal coupling pads;
      at least one first power pad, disposed adjacent to the first active surface;
      at least one first ground pad, disposed adjacent to the first active surface;
      at least one second power pad, disposed adjacent to the first back surface;
      at least one second ground pad, disposed adjacent to the first back surface; and
      at least one first through-chip via, electrically connecting the first power pad and the second power pad;
      at least one second through-chip via, electrically connecting the first ground pad and the second ground pad; and
   a second chip, electrically connected to the first chip, and the second chip comprising:
      a second active surface; facing the first active surface of the first chip;
      a second top metal layer, disposed adjacent to the second active surface, and spaced apart from the second active surface by a third distance;
      at least one second non-top metal layer, disposed adjacent to the second active surface, and spaced apart from the second active surface by a fourth distance, wherein the fourth distance is greater than the third distance;
      a plurality of third signal coupling pads, disposed on the second non-top metal layer and capacitively coupled to the first signal coupling pads of the first chip, so as to provide proximity communication between the first chip and the second chip;
      at least one third power pad, disposed adjacent to the second active surface and electrically connected to the first power pad of the first chip; and
      at least one third ground pad, disposed adjacent to the second active surface and electrically connected to the first ground pad of the first chip.

2. The semiconductor package as claimed in claim 1, wherein the first active surface of the first chip contacts the second active surface of the second chip.

3. The semiconductor package as claimed in claim 1, further comprising a third chip disposed adjacent to and electrically connected to the second chip.

4. The semiconductor package as claimed in claim 3, wherein the second chip further comprises a second back surface and a plurality of fourth signal coupling pads, the fourth signal coupling pads are disposed on the second back surface and electrically connected to the third signal coupling pads.

5. The semiconductor package as claimed in claim 4, wherein the second chip further comprises at least one fourth power pad, at least one fourth ground pad, at least one third through-chip via and at least one fourth through-chip via, the fourth power pad and the fourth ground pad are disposed adjacent to the second back surface, the third through-chip via electrically connects the third power pad and the fourth power pad, and the fourth through-chip via electrically connects the third ground pad and the fourth ground pad.

6. The semiconductor package as claimed in claim 3, wherein the third chip comprising:
   a third active surface, facing the second back surface of the second chip;
   a plurality of fifth signal coupling pads, disposed adjacent to the third active surface and capacitively coupled to the fourth signal coupling pads of the second chip, so as to provide proximity communication between the second chip and the third chip;
   at least one fifth power pad, disposed adjacent to the third active surface and electrically connected to the fourth power pad of the second chip; and
   at least one fifth ground pad, disposed adjacent to the third active surface and electrically connected to the fourth ground pad of the second chip.

7. The semiconductor package as claimed in claim 6, wherein the third active surface of the third chip contacts the second back surface of the second chip.

8. The semiconductor package as claimed in claim 6, wherein the third chip further comprises a third top metal layer and at least one third non-top metal layer, the third top metal layer and the third non-top metal layer are spaced apart from the third active surface by a fifth distance and a sixth distance respectively, the sixth distance is greater than the fifth distance, and the fifth signal coupling pads are disposed on the third non-top metal layer.

9. A method for making a semiconductor package, which comprises:
   (a) providing a first semiconductor device, wherein the first semiconductor device comprises a first active surface, a first back surface, a first top metal layer, at least one first non-top metal layer, a plurality of first signal coupling pads, a plurality of second signal coupling pads, at least one first power pad, at least one first ground pad, at least one second power pad and at least one second ground pad, the first top metal layer is disposed adjacent to the first active surface and spaced apart from the first active surface by a first distance, the first non-top metal layer is disposed adjacent to the first active surface and spaced apart from the first active surface by a second distance, the second distance is greater than the first distance, the first signal coupling pads are disposed on the first non-top metal layer, the second signal coupling pads are disposed adjacent to the first back surface and electrically connected to the first signal coupling pads, the first power pad and the first ground pad are disposed adjacent to the first active surface, the second power pad and the second ground pad are disposed adjacent to the first back surface;
   (b) providing a second semiconductor device, wherein the second semiconductor device comprises a second active surface, a second top metal layer, at least one second non-top metal layer, a plurality of third signal coupling pads, at least one third power pad and at least one third ground pad, the second active surface faces the first active surface of the first semiconductor device, the second top metal layer is disposed adjacent to the second active surface and spaced apart from the second active surface by a third distance, the second non-top metal layer is disposed adjacent to the second active surface and spaced apart from the second active surface by a fourth distance, the fourth distance is greater than the third distance, the third signal coupling pads are disposed on the second non-top metal layer and capacitively coupled to the first signal coupling pads of the first semiconductor device, so as to provide proximity communication between the first semiconductor device and the second semiconductor device, the third power pad and the third ground pad are disposed adjacent to the second active surface and electrically connected to the first power pad and the first ground pad of the first semiconductor device respectively;

(c) attaching the second semiconductor device to the first semiconductor device, wherein the second active surface of the second semiconductor device faces the first active surface of the first semiconductor device;

(d) removing part of the first semiconductor device, so as to form a first through hole and a second through hole, wherein the first through hole extends from the first power pad to the second power pad, and the second through hole extends from the first ground pad to the second ground pad; and (e) forming a conductive material in the first through hole and the second through hole, so as to form a first through-wafer via and a second through-wafer via, wherein the first through-wafer via electrically connects the first power pad and the second power pad, and the second through-wafer via electrically connects the first ground pad and the second ground pad.

10. The method as claimed in claim 9, wherein in step (c), the first active surface of the first semiconductor device contacts the second active surface of the second semiconductor device.

11. The method as claimed in claim 9, wherein in step (d), the first through hole and the second through hole are formed by laser drilling.

12. The method as claimed in claim 9, wherein in step (d), part of the second semiconductor device is removed to form the first through hole and the second through hole.

13. The method as claimed in claim 9, wherein in step (e), the conductive material is formed by plating.

14. The method as claimed in claim 9, further comprising a step of forming a plurality of conductive bumps on the first back surface of the first semiconductor device after step (e).

15. The method as claimed in claim 9, further comprising:

(f) providing a third semiconductor device, wherein the third semiconductor device comprises a third active surface, a plurality of fifth signal coupling pads, at least one fifth power pad and at least one fifth ground pad, the third active surface faces the second back surface of the second semiconductor device, the fifth signal coupling pads are disposed adjacent to the third active surface and capacitively coupled to the fourth signal coupling pads of the second semiconductor device, so as to provide proximity communication between the second semiconductor device and the third semiconductor device, the fifth power pad and the fifth ground pad are disposed adjacent to the third active surface and electrically connected to the fourth power pad and the fourth ground pad of the second semiconductor device respectively; and (g) attaching the third semiconductor device to the second semiconductor device, wherein the third active surface of the third semiconductor device faces the second back surface of the second semiconductor device.

16. The method as claimed in claim 15, wherein in step (b), the second semiconductor device further comprises a second back surface and a plurality of fourth signal coupling pads, the fourth signal coupling pads are disposed on the second back surface and electrically connected to the third signal coupling pads.

17. The method as claimed in claim 16, wherein in step (b), the second semiconductor device further comprises at least one fourth power pad, at least one fourth ground pad, at least one third through-wafer via and at least one fourth through-wafer via, the fourth power pad and the fourth ground pad are disposed adjacent to the second back surface, the third through-wafer via electrically connects the third power pad and the fourth power pad, and the fourth through-wafer via electrically connects the third ground pad and the fourth ground pad.

18. The method as claimed in claim 15, wherein in step (f), the third semiconductor device further comprises a third top metal layer and at least one third non-top metal layer, the third top metal layer and the third non-top metal layer are spaced apart from the third active surface by a fifth distance and a sixth distance respectively, the sixth distance is greater than the fifth distance, and the fifth signal coupling pads are disposed on the third non-top metal layer.

19. The method as claimed in claim 15, wherein in step (g), the third active surface of the third semiconductor device contacts the second back surface of the second semiconductor device.

20. The method as claimed in claim 9, wherein in the step (a), the first semiconductor device is a chip, in the step (b), the second semiconductor device is a chip.

21. The method as claimed in claim 9, wherein in the step (a), the first semiconductor device is a wafer, in the step (b), the second semiconductor device is a wafer, and after step (e), further comprises a step of sawing the first semiconductor device and the second semiconductor device, so that the wafers are divided into chips.

* * * * *